United States Patent
Brantley et al.

(10) Patent No.: US 8,050,148 B2
(45) Date of Patent: Nov. 1, 2011

(54) FLASH TIME STAMP APPARATUS

(75) Inventors: Steven Graham Brantley, Satellite Beach, FL (US); James Richard MacLean, Melbourne, FL (US); Francesco Cavaliere, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 661 days.

(21) Appl. No.: 12/195,629

(22) Filed: Aug. 21, 2008

(65) Prior Publication Data

US 2010/0001777 A1  Jan. 7, 2010

Related U.S. Application Data

(60) Provisional application No. 61/077,869, filed on Jul. 3, 2008.

(51) Int. Cl.
*G04F 8/00* (2006.01)
*H03M 1/12* (2006.01)

(52) U.S. Cl. .......................... 368/120; 341/156; 702/79

(58) Field of Classification Search .................. 368/113, 368/118, 120; 341/156, 166; 702/79
See application file for complete search history.

(56) References Cited

U.S. PATENT DOCUMENTS

| | | | | | |
|---|---|---|---|---|---|
| 4,731,768 | A | * | 3/1988 | Easterday | 368/118 |
| 5,166,959 | A | * | 11/1992 | Chu et al. | 377/20 |
| 5,650,739 | A | * | 7/1997 | Hui et al. | 327/262 |
| 5,694,377 | A | * | 12/1997 | Kushnick | 368/120 |
| 5,838,754 | A | * | 11/1998 | Gorbics et al. | 377/20 |
| 6,073,259 | A | * | 6/2000 | Sartschev et al. | 714/724 |
| 6,268,753 | B1 | * | 7/2001 | Sandusky | 327/266 |
| 6,868,047 | B2 | * | 3/2005 | Sartschev et al. | 368/118 |
| 7,710,835 | B2 | * | 5/2010 | Kim et al. | 368/120 |

OTHER PUBLICATIONS

U.S. Appl. No. 12/195,656, Brantley et al.
Antti Mantyniemi, An integrated CMOS high precision time-to-digital converter based on stabilised three-stage delay line interpolation, 2004, Oulu, Finland ISBN 951-42-7460-1. ISBN 951-42-7461-X (PDF). URL http://herkules.oulu.fi/isbn951427461X/.

* cited by examiner

*Primary Examiner* — Vit Miska
(74) *Attorney, Agent, or Firm* — John J. Patti; Wade J. Brady, III; Frederick J. Telecky, Jr.

(57) ABSTRACT

One embodiment of an apparatus for generating a time stamp includes a clock input, an event signal input and a time stamp output. A DLL is connected to the clock input, with a plurality of delay elements inside the DLL. An output of each of the delay elements is connected to a data input on a latch. An event signal input is connected to an enable input on each of the latches. An output of each of the latches is connected to the time stamp output. The apparatus is adapted to produce a value on the time stamp output indicating a point at which the event signal input transitions between transitions on the clock input.

20 Claims, 6 Drawing Sheets

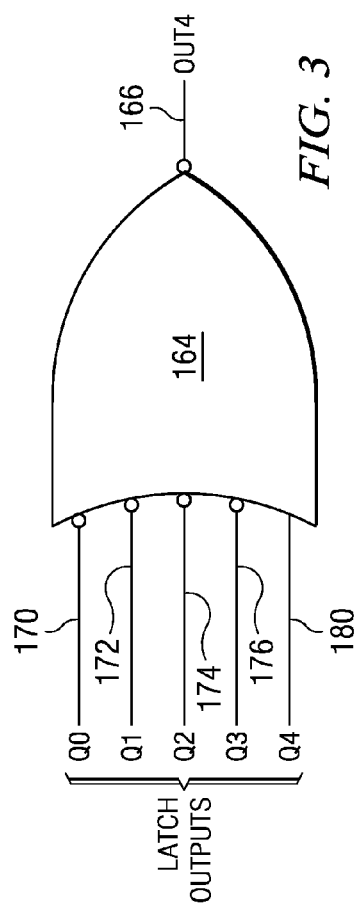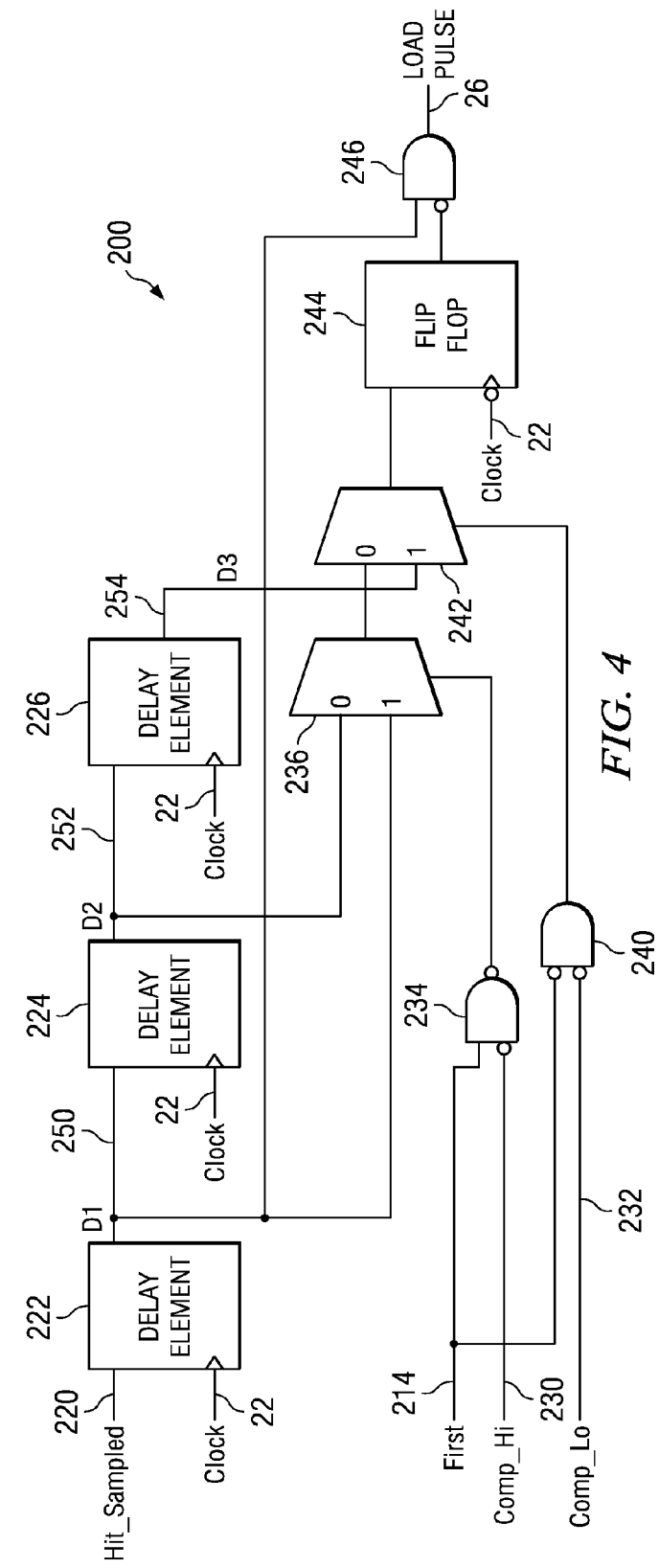

FLASH TIME STAMP APPARATUS

CROSS REFERENCE TO RELATED APPLICATION

The present application claims priority to (i.e., is a non-provisional of) U.S. Provisional Patent Application No. 61/077,869 entitled "Flash Time Stamp Apparatus", and filed Jul. 3, 2008 by Brantley et al. The aforementioned application is assigned to an entity common hereto, and the entirety of the aforementioned application is incorporated herein by reference for all purposes.

BACKGROUND OF THE INVENTION

Electronic time stamp or time measurement circuits are used to produce highly precise digital time measurements for a wide variety of applications such as automated test equipment, bench top time measurement equipment, radar and sonar devices, etc. Conventional time stamp circuits generate the time stamps using a digital counter that increments at each rising edge of an oscillating clock signal, with the resulting count from the digital counter representing the time at which an event occurred. For example, the time it takes for a radar signal to travel to a target, reflect and return can be measured using two time stamps, one taken when the radar signal is transmitted and another taken when the reflected radar signal returns. The counter values for the two time stamps may be subtracted to calculate the elapsed time.

The precision at which a time stamp circuit can measure the time between two events is typically dependent on the clock speed. Generating precise time stamps for high speed events thus becomes complicated by the difficulty in generating high speed clocks and electronic circuits that can count the high speed clocks. For example, generating a time stamp with a resolution of 833 picoseconds requires a clock that runs at 1.2 GHz. If a time stamp with a resolution of 13 ps is required, the clock in a traditional time stamp circuit must run at 76.9 GHz. Thus, as the resolution required for a time stamp increases, it becomes impossible for conventional electronic time stamp circuits to run and count quickly enough to provide the required resolution.

Hence, for at least the aforementioned reasons, there exists a need in the art for a time stamp apparatus having a resolution that is not limited by the clock speed.

BRIEF SUMMARY OF THE INVENTION

The present invention is related to time stamp apparatuses, and in particular to interpolating time stamp apparatuses with a flash based architecture.

Some embodiments of the present invention provide apparatuses for generating a time stamp. One embodiment of an apparatus for generating a time stamp includes a clock input, an event signal input and a time stamp output. A DLL is connected to the clock input, with a plurality of delay elements inside the DLL. An output of each of the delay elements is connected to a data input on a latch. An event signal input is connected to an enable input on each of the latches. An output of each of the latches is connected to the time stamp output. The apparatus is adapted to produce a value on the time stamp output indicating a point at which the event signal input transitions between transitions on the clock input.

Other embodiments of the present invention provide methods for generating a time stamp. One particular embodiment of a method for generating a time stamp includes providing a plurality of divided clock outputs by dividing a clock cycle into a plurality of shorter periods using delay elements inside a DLL, storing a state of each of the plurality of divided clock outputs in a latch when an event signal changes state, and generating the time stamp using at least the stored state of each of the plurality of divided clock outputs.

Another particular embodiment of an apparatus for generating a time stamp includes a clock input, an event signal input and a time stamp output. A DLL is connected to the clock input, with a plurality of delay elements inside the DLL. A plurality of RC delay lines is provided, each being connected to one of the plurality of delay elements. The RC delay lines include a resistance comprising at least one resistor and a capacitance comprising a parasitic capacitance of at least one of the plurality of latches. Each of the plurality of RC delay lines has a current source connected at an end, the at least one current source being adapted to alter a time constant of the at least one of the plurality of RC delay lines by applying a current to the RC delay lines. The apparatus also includes a plurality of latches, wherein the plurality of latches are connected to a plurality of different delay points on each of the plurality of RC delay lines, each of the plurality of latches also having an enable input connected to the event signal input. The apparatus also includes a detector connected to an output of each of the plurality of latches, the detector comprising a plurality of NOR gates, each of the plurality of NOR gates having a plurality of inputs connected to a number of contiguous ones of the plurality of latches. The apparatus further includes a decoder connected to an output of the detector, the decoder being adapted to convert a 2M-bit input to an M-bit output. The decoder also includes a comparator adapted to generate a signal indicating whether a value from the plurality of latches is greater than a threshold value and a second comparator adapted to generate a second signal indicating whether the value from the plurality of latches is greater than a second threshold value. The apparatus also includes a counter, and is adapted to produce a value on the time stamp output based at least in part on an output of the counter as the most significant bits of the time stamp and the M-bit output of the decoder as the least significant bits of the time stamp.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

FIG. 3 is a schematic diagram of an exemplary 5-input NOR gate that may be used in a detector/filter of an interpolator;

FIG. 4 is a schematic diagram of a counter edge selector according to one particular embodiment of the invention;

DETAILED DESCRIPTION OF THE INVENTION

Figure 1:
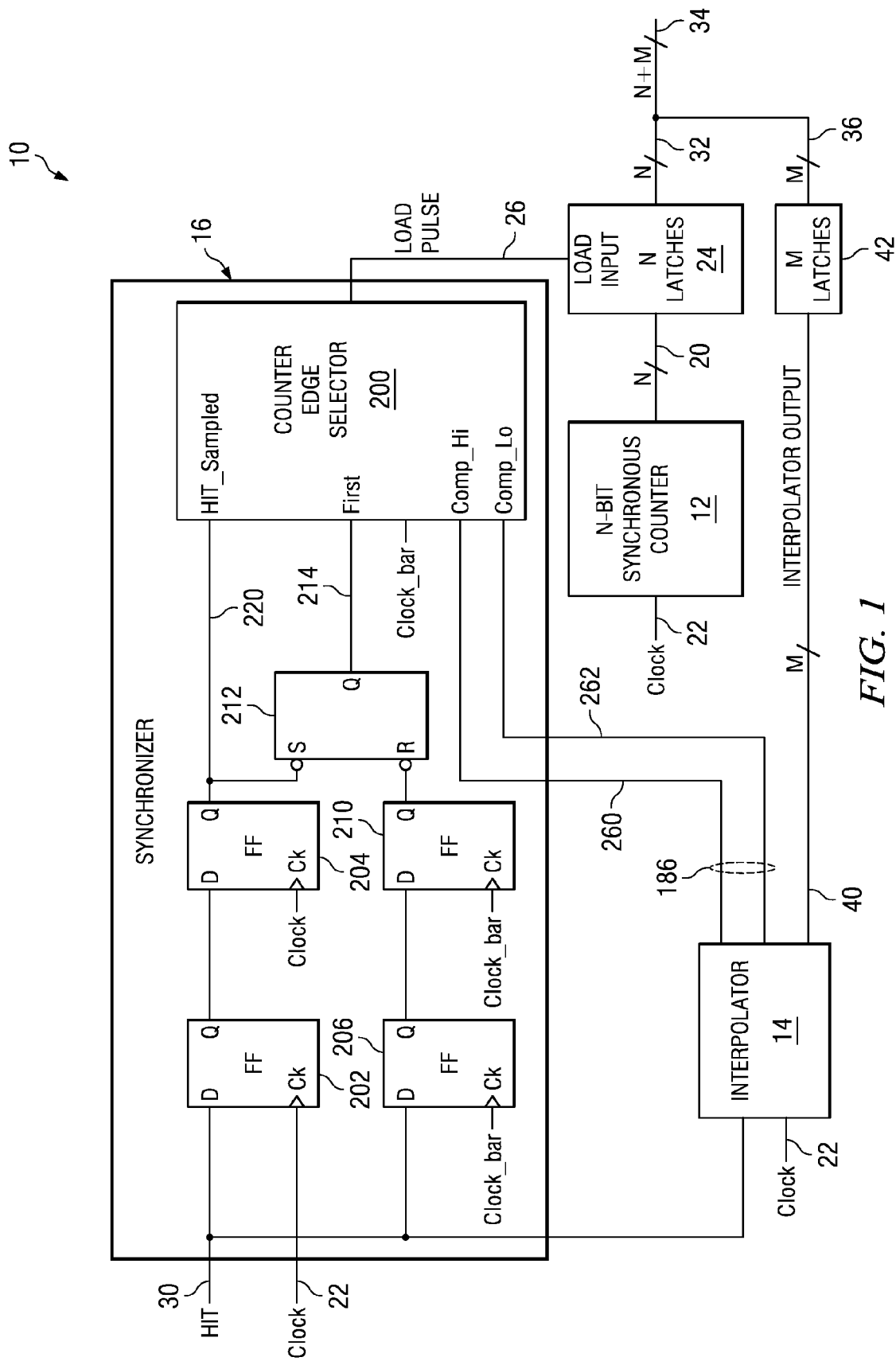
FIG. 1 is a schematic diagram of a time stamp apparatus according to one particular embodiment of the invention.

The present invention is related to time stamp apparatuses, and in particular to interpolating time stamp apparatuses with a flash-based architecture. The time stamp apparatuses generate a time stamp when an event occurs by capturing the state of an electronic counter when an event signal changes state. The time stamp apparatuses disclosed herein generate a time stamp using a combination of a coarse time sample and a fine time sample. The counter generates the coarse time sample and an interpolator generates the fine time sample, improving the counter time stamping resolution by a factor of $2^M$, for example by 64 in one particular embodiment, by interpolating between counter clock edges. The interpolator has a flash-based architecture that simultaneously samples the state of the event signal at multiple fractions of the counter clock period. The flash architecture provides for very high data throughput and very high precision, without the need for trimming. One particular embodiment of the interpolator wraps a delay lock loop (DLL) control loop around delay elements to directly produce the clock phase for latches that capture the time stamp, in contrast to previous architectures that may use delay elements that are controlled by a DLL, but are not actually in a DLL control loop, and that rely on matching to elements that are in a DLL. In a multiple channel implementation, each channel may be provided with its own DLL, virtually eliminating channel-to-channel crosstalk. The interpolator having delay elements inside the DLL uses fewer delay elements and logic gates that need to match precisely, resulting in low errors, even without trimming. Fully differential logic may be achieved using a bipolar process to provide for very quiet circuit switching, further improving accuracy. The use of RC delay lines to latches arranged in a flash architecture in the interpolator for the final 2 bits of precision provides a low power way of improving the resolution. The RC delay lines may optionally be trimmed with a DC current allowing for fine tuning, but need not be trimmed to achieve good performance. The interpolator also provides for a relatively high interpolation ratio without a large number of power consuming components.

Other solutions for providing the high resolution least significant bits of a time stamp high resolution solutions involve "time stretching", where the interpolation process uses the difference in gate delays, or oscillators running at different frequencies, to resolve the residue. With time stretching, the interpolation process takes additional time to complete. The various embodiments of an interpolator described herein use a flash-based architecture with no time stretching.

The time stamp counter runs synchronously to a clock, while the interpolator is asynchronous. A synchronizer may be used to synchronize the capturing of the coarse time stamp to the interpolator. The synchronizer also provides a very low metastability error rate, while maintaining high data throughput, and high noise immunity. Because the event pulse is asynchronous with the clock, there is an ambiguous region near the clock edge, where the setup time of the synchronizing flip flop is not met. Without the synchronizer, the time stamp resulting from the combination of a coarse sample and the interpolated fine sample or interpolator residue may be off by an entire clock cycle if the fine sample is added to a coarse sample from the wrong clock period. The synchronizer samples the event pulse with the rising and falling edges of the clock, and then is able to make an unambiguous synchronization decision, with substantial timing margin, even if one of the samples is ambiguous. The synchronizer thus decides which counter value to add to the interpolator residue. It does this by sampling the event pulse with both edges of the clock, using a flip flop clocked with the rising edge of the clock, and another one clocked with the falling edge. A latch then determines which flip flop sampled the event pulse first. This narrows down the region of the clock where the event pulse could have occurred to slightly more than ½ of a clock cycle, and conversely also determines a region of slightly less than ½ of clock cycle where the event pulse could not have occurred. The synchronizer then looks at the digital output of the interpolator (the residue) to determine whether it is above (after) or below (before) the region in which the event pulse could not have occurred. This information is then decoded to select which counter state to add to the interpolator residue. Since the region in which the event pulse could not have occurred is known to within slightly less than ½ of a clock cycle, a threshold can be set in the middle of this region to compare with the interpolator output, resulting in a comparison which has close to ½ of a clock cycle of timing margin. This margin provides a high degree of timing jitter rejection, and also allows the synchronizer to work even with substantial variation in the setup and hold time of the synchronizing flip flops. Because multiple flip flops can be used to sample the event pulse, the metastability error rate can be made extremely low. The synchronizer may be used with the interpolator described herein or with any other suitable fine resolution time stamp circuits, including those involving time stretching.

The time stamp apparatus may be implemented using any suitable process technology. In one particular embodiment, the time stamp apparatus uses a high speed silicon germanium BiCMOS process. The choice of a BiCMOS process encourages the design of a very efficient implementation in order to control power dissipation. It also provides for ECL-like differential switching circuits that have very high speeds and low noise. However, the time stamp apparatus is not limited to this exemplary process technology.

Referring now to FIG. 1, the time stamp apparatus 10 in one particular embodiment has three functional blocks, a counter 12, an interpolator 14 and a synchronizer 16 that synchronizes the counter 12 to the interpolator 14. The counter 12 is an N-bit synchronous counter. That is, the counter 12 has N outputs 20 that present a binary encoded value representing the number of rising edges detected on a clock input 22 after the counter 12 is started. When an event occurs, the count is recorded in a bank of N latches 24, one per counter output bit. The N latches 24 are enabled or triggered by a control signal 26 based on an event signal Hit 30 that transitions with a rising edge to capture a time stamp. The bank of N latches 24 has an N-bit output 32 that persistently carries the value of the counter 12 when the event occurred, representing the N most significant bits of the time stamp 34. In one particular embodiment, the counter 12 is 34 bits wide.

(N=34) The counter 12 thus time stamps an asynchronous event pulse at a resolution equal to the clock period of the counter 12. In one particular embodiment, the clock 22 has a period of 833 ps.

The interpolator 14 is used to provide the M least significant bits 36 of the time stamp 34. In one particular embodiment, the interpolator 14 output is 6 bits wide. (M=6) The interpolator 14 produces an M-bit binary encoded output 40 representing the time at which the event occurred, with a resolution greater than that provided by the clock signal 22. The M-bit output of the interpolator 14 is captured by a bank of M latches 42 that are triggered by the same load pulse control signal 26 as the N latches 24 used to capture the output of the counter 12. The bank of M latches 42 persistently carries the M least significant time stamp bits 36 that are combined with the N most significant bits 32 from the counter 12 and N latches 24 to form the time stamp 34. Note that because the interpolator 14 includes internal latches, the bank of M latches 42 may not be needed in some embodiments, for example if the system were capturing only a single time stamp. However, in one embodiment, the N-bit synchronous counter 12 runs continually, and the Hit signals can arrive continuously, so the results from the interpolator 14 are temporarily stored in the bank of M latches 42. The $2^M$ latches 44 in the interpolator 14 are first latched, then the synchronizer 16 determines the proper value of the counter 12 to use, and the control signal 26 combines the coarse sample from the counter 12 with the fine sample from the interpolator 14 as stored in the bank of M latches 42. By latching the output of the interpolator 14 in the bank of M latches 42, the interpolator 14 is freed up to capture another sample while the synchronizer 16 is working on the time stamp captured by the previous Hit signal 30. The bank of M latches 42 thus essentially act as a pipeline, giving the time stamp apparatus 10 a higher throughput for multiple time stamps.

Figures 2, 2A:
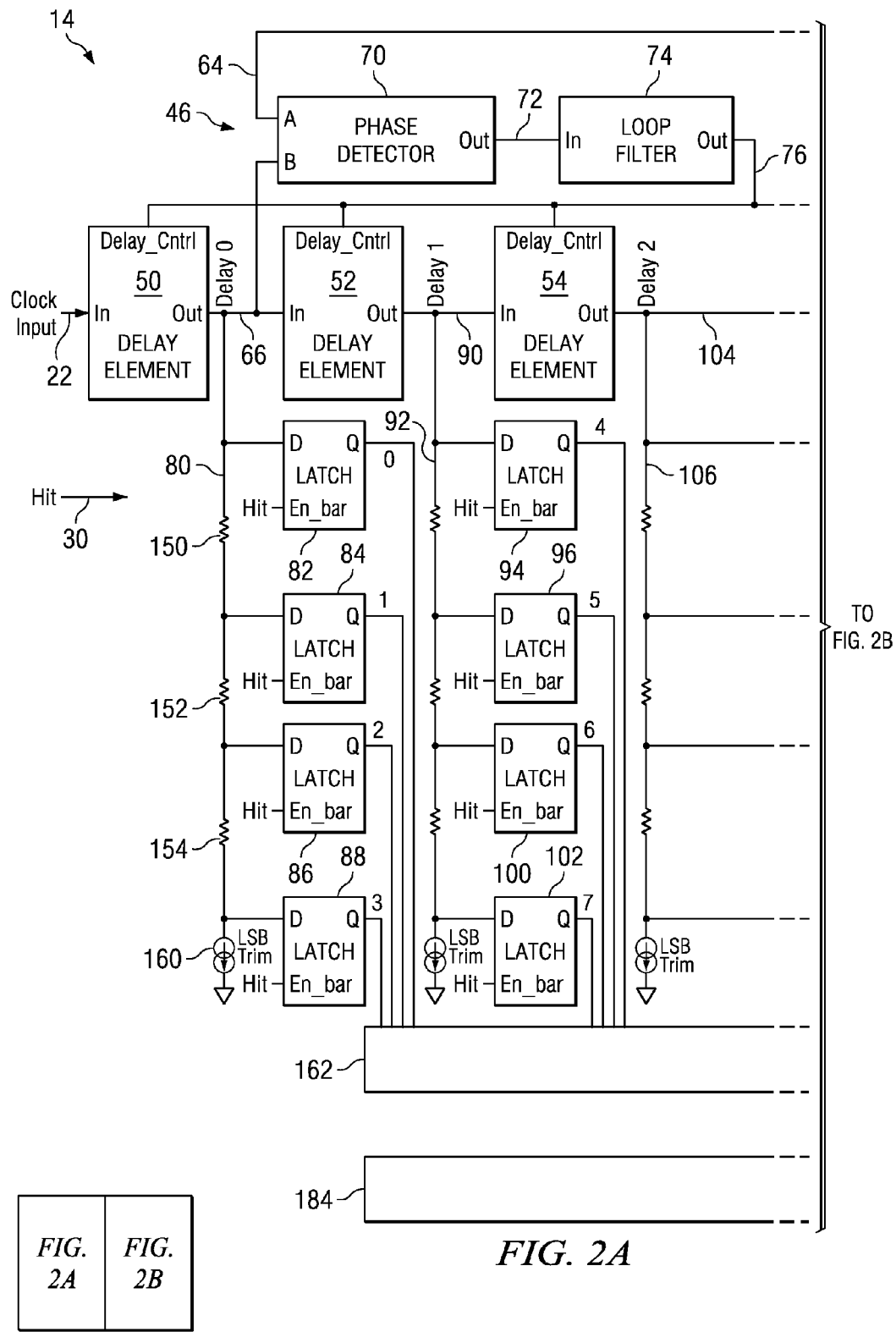
FIG. 2 is a schematic diagram of an interpolator according to one particular embodiment of the invention.
Figure 2B:
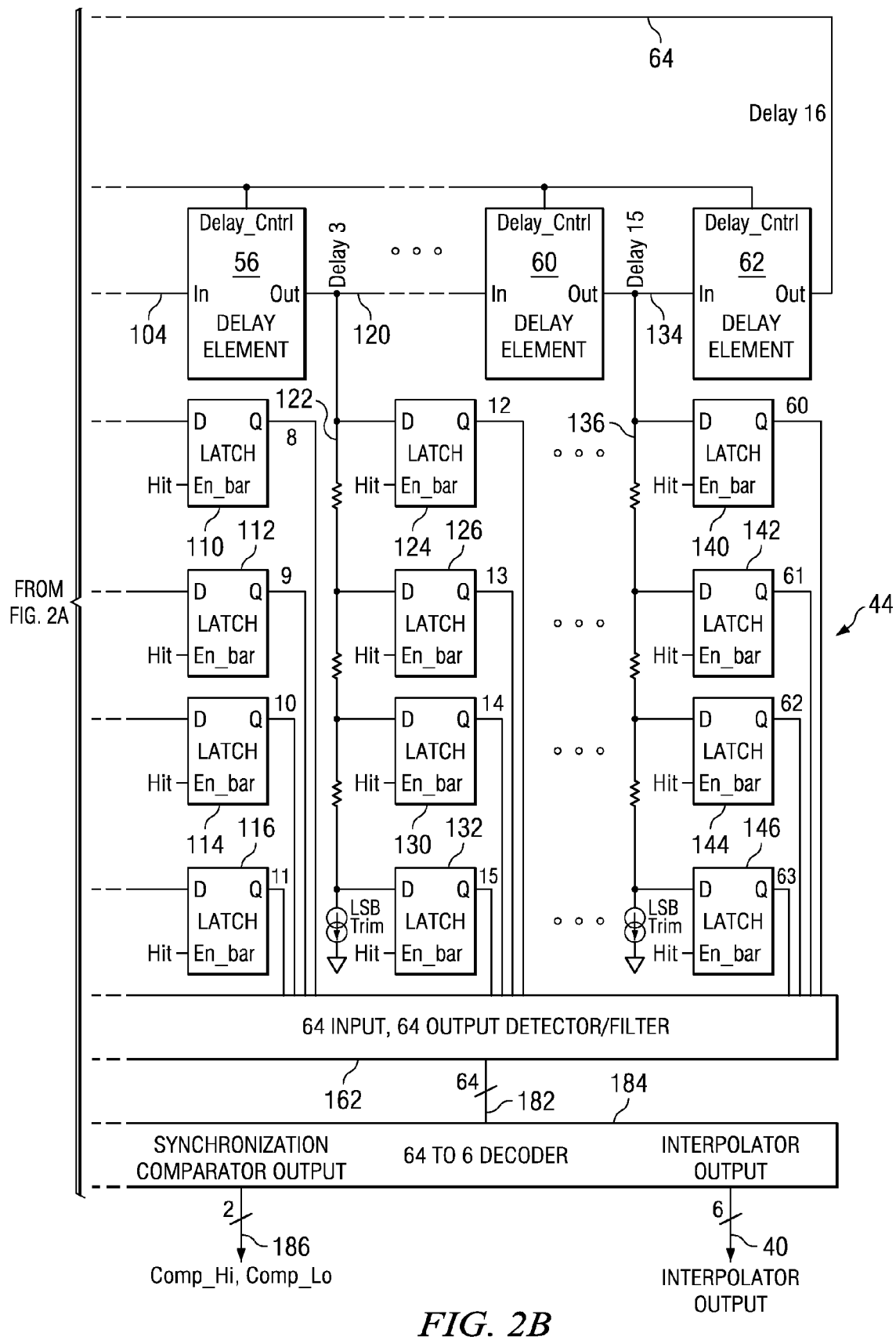

Referring now to FIG. 2, the interpolator 14 will be described in more detail. A DLL 46 is used to divide the clock 22 into a number of equal portions or phases by delay elements 50, 52, 54, 56, 60 and 62. Delay elements 50-62 are connected in series with the clock 22 connected to the input of the first delay element 50, each delay element (e.g., 50) producing at its output an increasingly delayed version of the clock for the input of the next delay element (e.g., 52) in the loop. The DLL 46 of one particular embodiment includes 17 delay elements 50-62 (some of which are not shown in FIG. 2 for simplicity) to divide the clock 22 into 16 equal portions. The output 64 of the last delay element 62 and the output 66 of the first delay element 50 are connected to two inputs of a phase detector 70 in the DLL 46. The phase detector 70 produces an output 72 that indicates which of the outputs 64 or 66 of the last and first delay elements 62 and 50 transitions first. The output 72 acts as an error signal that goes to zero as the phase of the output 64 and 66 are aligned. The output 72 of the phase detector 70 is connected to the input of a loop filter 74. The loop filter 74 is a low pass filter that provides a control signal 76 that is connected to the delay control inputs of the delay elements 50-62 to adjust their delay. Because the same control voltage on the control signal 76 is applied to each of the delay elements 50-62, they apply substantially the same delay to the clock at their inputs. In operation, the DLL 46 locks the phase of the output 64 of the last delay element 62 to the phase of the output 66 of the first delay element 50. If the output 64 of the last delay element 62 becomes later than the output 66 of the first delay element 50 as determined by the phase detector 70, meaning that the output 64 transitions after the output 66, the control signal 76 reduces the delay of the delay elements 50-62. If the output 64 of the last delay element 62 becomes earlier than the output 66 of the first delay element 50 as determined by the phase detector 70, meaning that the output 64 transitions before the output 66, the control signal 76 increases the delay of the delay elements 50-62. The phase of the output 64 of the last delay element 62 is thus locked to the phase of the output 66 of the first delay element 50, with the output 64 of the last delay element 62 being exactly one clock cycle later than the output 66 of the first delay element 50. Again, the interpolator 14 is not limited to any particular number of delay elements in the interpolator 14, and any suitable type of delay element may be used to produce the clock phases.

Note that the output 64 of the last delay element 62 in the interpolator 14 is compared to the output 66 of the first delay element 50 for accuracy reasons. The output 64 could be compared directly with the clock 22, but differences in the rise/fall time of the clock 22 and the outputs of the delay elements 52-62 may introduce errors in the DLL 46. The first delay element 50 may therefore be included to buffer the clock 22.

The output of each delay element 50-60 but the last 62 is used as the input to an RC delay line driving a bank of latches. For example, the output 66 of the first delay element 50 drives an RC delay line 80 that is sampled at four different time delay points by a bank of latches 82, 84, 86 and 88. The output 90 of the second delay element 52 drives an RC delay line 92 that is sampled at four different time delay points by latches 94, 96, 100 and 102. The output 104 of the third delay element 54 drives a column circuit (which generally comprises an RC delay line 106 that is sampled at four different time delay points by latches 110, 112, 114 and 116). The output 120 of the fourth delay element 56 drives a column circuit (which generally comprises an RC delay line 122 that is sampled at four different time delay points by latches 124, 126, 130 and 132). Additional RC delay lines and banks of latches (which form column circuits) are included for each successive delay element in the DLL 46. (As indicated above, some intermediate delay elements and their associated RC delay lines and banks of latches are omitted from FIG. 2 for the sake of simplicity in the drawing.) The output 134 of the second-to-last delay element 60 drives an RC delay line 136 that is sampled at four different time delay points by latches 140, 142, 144 and 146. The last delay element 62 is included (and without associated latches) so that the period covered by the interpolator 14 does not extend into the next clock cycle. Without the inclusion of the last delay element 62, the last bank of latches 140, 142, 144 and 146 associated with the second-to-last delay element 60 would sample a portion of a later clock cycle than the clock cycle sampled by the other latches in the $2^M$ latches 44 of the interpolator 14.

The $2^M$ latches 44 in the interpolator 14 are transparent when the event signal Hit 30 is low, so that their outputs follow the changes in the variously delayed version of the clock 22 at each latch. When the event signal Hit 30 goes high the $2^M$ latches 44 latch and capture the state of the timing wave that comes through the interpolator 14. Thus, when the transition on the event signal Hit 30 appears, the $2^M$ latches 44 all latch at exactly the same time and half of them will catch a 1 and half will catch a 0. The point in the $2^M$ latches 44 at which the $2^M$ latches 44 change from a 1 to a 0 indicates where the event occurred in time.

Each RC delay line (e.g., 80) includes a number of resistors 150, 152 and 154 connected in series to the output (e.g., 66) of the associated delay element (e.g., 50). Note that the RC delay lines (e.g., 80) are not voltage dividers as would be included in a flash data converter. The RC delay lines (e.g., 80) are not grounded at one end and do not act to provide voltage divided samples. Rather, the RC delay lines provide time delayed samples. The parasitic capacitance of the RC delay lines (e.g., 80) and of the associated latches (e.g., 82, 84, 86 and 88) work together with the series connected resistors (e.g., 150, 152 and 154) to form time constants that divide the period covered by the associated delay element (e.g., 50) into equal slices that may be sampled by the latches (e.g., 82, 84, 86 and 88). The values of the resistors (e.g., 150, 152 and 154) are selected based on the system capacitance at each sample point so that the period covered by each delay element (e.g., 50) is sampled at evenly divided portions of the period. In one particular embodiment, the capacitance of the particular interpolator 14 design and layout is either calculated or measured, and the resistor values are then set accordingly. If the system capacitance at each sample point is equal, the values of the resistors (e.g., 150, 152 and 154) may also be equal to create equal time delay divisions. Note, however, that the interpolator 14 is not limited to the equal delays of this particular embodiment, and may be adapted as desired without departing from the inventive concepts disclosed herein. Similarly, the interpolator 14 may be adapted to set the delays in the delay lines in any suitable manner. For example, capacitors may be added to the RC delay lines, or other delay mechanisms may be employed. The period or phase associated with each delay element (e.g., 50) may be divided into as many subdivisions as desired, and is not limited to the 4 samples per delay element shown in FIG. 2. If additional latches are connected to the RC delay lines (e.g., 80) at additional nodes, the RC time constants would be adjusted accordingly so that each latch samples at the desired delay point.

In one particular embodiment, the RC delay lines (e.g., 80) are each tuned by a current source (e.g., 160) that pulls a small DC current through the RC delay line (e.g., 80), altering the time delay through the delay line. The small current results in a DC offset voltage, which produces a time offset due to the rise time of the signal. The time offset is equal to the DC offset voltage divided by the rate of change of the voltage. The time offset this produces is well controlled, because the rise time is controlled by the DLL control loop. For example, to increase the time delay of the delay line, the current from the current source 160 flows away from the delay element 50, generating a negative offset voltage on the delay line, which results in the voltage at the input to the latch 88 reaching the switching threshold of the latch 88 at a later time. The current sense and strength may be adjusted or trimmed either statically at design time, or dynamically using a calibration process at startup or later during operation.

The outputs of the $2^M$ latches 44 are processed and filtered by a $2^M$ input, $2^M$ output detector/filter 162. Again in one particular embodiment, M=6 and $2^M$=64. The detector/filter 162 determines where in the clock cycle the event signal Hit 30 occurred by detecting the transition from one state to the other in the $2^M$ bit input. For example, roughly half of the $2^M$ bit inputs will be zero or low and the other half will be one or high. The time at which the event signal Hit 30 transitioned with a rising edge may be determined by identifying where in the $2^M$ bit input the state transitions, based on the knowledge of the delay at which each of the $2^M$ inputs were sampled.

The detector/filter 162 also performs a filtering function to reliably determine where the transition occurs. The desired states of a series of the $2^M$ inputs would be 111000. However, due to signal noise and jitter, the transition may appear fuzzy, such as 110100. Again in one particular embodiment, the detector/filter 162 requires a 11110 sequence from 5 consecutive latches before passing the event pulse to the output, and is implemented as a series of 5-input NOR gates. Without the filter in the detector/filter 162 to reliably determine where the transition took place, the detector may produce more than one true output, which would result in an incorrect result from the binary decoder that follows the detector/filter. One exemplary 5-input NOR gate 164 that may be used in the detector/filter 162 to generate a single one 166 of the 64 output bits is illustrated in FIG. 3. Input bits 0-3 170, 172, 174 and 176 to the detector/filter 162 from RC delay line 80 are connected to inverting inputs of the 5-input NOR gate 164, and input bit 4 180 from RC delay line 92 is connected to a non-inverting input of the 5-input NOR gate 164. The output of the 5-input NOR gate 164 generates bit 4 166 of the 64 bit output 182 of the detector/filter 162 and is true only for input 11110 as discussed above. Similarly, output bit 5 would be generated from a combination of input bits 1-5. Output bit 60 would be generated from a combination of input bits 56-60. At the edges of the input, the combinations wrap around. For example, output bit 2 would be generated from a combination of output bits 62, 63, 0, 1 and 2. Each output bit of the detector/filter 162 is generated by a NOR gate such as gate 164 illustrated in FIG. 3. If there are 64 latches in the interpolator 14, there are 64 NOR gates in the detector/filter 162. The NOR gates may have the exemplary 5 inputs each, or may have another number of inputs depending on the desired amount of filtering to be performed in the detector/filter 162. Each latch is spaced in time 1 LSB apart, for example, 13 ps in one particular embodiment, so 5 input NOR gates provide filtering of 5 LSB's for noise on the event signal Hit 30 or clock 22.

The $2^M$-bit output 182 of the detector/filter 162 is processed by a $2^M$ to M bit decoder 184 that produces an M bit binary encoded output 40 from the $2^M$ samples at the input. The M bit binary encoded output 40 has a value that represents the delay period, from 0 to $2^M-1$, at which the transition from 0 to 1 falls as identified by the detector/filter 162. The value of the binary encoded output 40 thus represents the time stamp indicating when the event signal Hit 30 transitioned. As will be described in more detail below, the M-bit binary encoded output 40 also provides synchronization control signals 186 causing the N latches 24 to sample the counter 12 at the proper time to synchronize the counter 12 with the interpolator 14.

In summary, the interpolator 14 improves on the 833 ps resolution provided by the clock 22 and the counter 12 by a factor of $2^M$ (or, in one embodiment, $2^6$ or 64) by interpolating between clock edges. The interpolator 14 uses a flash architecture, using the bank of $2^M$ latches 44 to capture the time at which the event pulse Hit 30 transitions. All $2^M$ latches 44 are latched at the same time by a rising edge on the event signal Hit 30. The input clock 22 to the interpolator 14 is split into $2^M$ phases, at a spacing equal to the clock period divided by $2^M$. Each phase of the clock 22 is connected to the D input of a latch (e.g., 82), so that at the time of the event pulse, the $2^M$ latches capture the state of the $2^M$ clock phases. The latch outputs are then decoded by the decoder 184 to produce an M bit output, which represents how far between 2 adjacent counter states the pulse on the event signal Hit 30 occurred (the residue). The $2^M$ to M decoder 184 is carefully implemented to prevent large errors from occurring at the DLL boundaries, due to clock jitter. The $2^M$ clock phases are produced by a DLL 46 with $2^M/4$ stages, which is phase locked to the main clock 22, plus 3 RC delay taps off of each DLL stage. The RC delay taps are implemented using resistors (e.g., 150), and the input capacitance of the latches (e.g., 84) plus parasitic capacitance of the signal traces, etc. The RC delay can be adjusted by injecting a small DC current in to, or out of, the end of the delay line using a current source (e.g., 160). This produces a DC offset, which produces a time offset due to the rise time of the signal. The time offset this produces is well controlled, since the rise time is controlled by the DLL loop 46. If the time stamp circuits include multiple channels, a separate DLL (e.g., 46) is employed for each channel, virtually eliminating crosstalk between channels. Again, the interpolator 14 in the time stamp apparatus 10 is not limited to any particular number of time divisions, delay elements, or latches per delay element.

The term "flash-based architecture" is used herein to refer to an architecture in which multiple samples of the event Hit signal 30 may be sampled at once or substantially simultaneously. The flash-based architecture may employ any suitable method for delaying the event Hit signal 30 to provide simultaneous access to multiple samples of varying delays, including the bank of latches connected to a DLL and RC delay lines disclosed herein.

Turning again to FIG. 1, the synchronizer 16 in the time stamp apparatus 10 will be described in more detail. The interpolator 14 controls the synchronization process so that the control signal 26 latches the value of the counter 12 during the same clock period in which the interpolator 14 captured the transition on the event signal Hit 30. Because the event signal Hit 30 is an asynchronous signal and the interpolator 14 is asynchronous, there are ambiguous regions near the clock edges that may lead to an incorrect coarse time stamp from the counter 12 being added to the fine time stamp from the interpolator 14. The synchronizer 16, under the control of the interpolator 14, ensures that the interpolator 14 and counter 12 both produce a time stamp from the same counter period. For example, the interpolator subdivides a period in one clock cycle, such as clock count 12. If the event occurs near a clock edge, the counter 12 does not have the resolution to distinguish whether the event occurred just before the clock edge or just after. Thus, without the interpolator 14, the value of the counter 12 might be latched at count 11 or count 13, rather than the correct count 12. The synchronizer 16 samples the incoming event signal Hit 30 with the clock 22, using both edges of the clock 22 and effectively doubling the sampling resolution. A counter edge selector 200, under control of the synchronization control signals 160 from the interpolator 14, selects the proper counter state to latch to guarantee that is consistent with the same clock period the interpolator 14 was working with. (The counter edge selector 200 may also be referred to herein as a clock edge selector.)

The synchronizer 16 has an input for the clock 22 and an input for the event signal Hit 30. A chain of flip flops 202 and 204 sample the event signal Hit 30 on rising edges of the clock 22, and another chain of flip flops 206 and 210 sample the event signal Hit 30 on falling edges of the clock 22. The event signal Hit 30 is connected to the D inputs of the lead flip flops 202 and 206. The output of rising flip flop 202 is connected to the D input of the second rising flip flop 204. The output of falling flip flop 206 is connected to the D input of the second falling flip flop 210. The output of the second rising flip flop 204 is connected to the inverting S input of an SR flip flop 212, and the output of the second falling flip flop 210 is connected to the inverting R input of the SR flip flop 212. The SR flip flop 212 determines whether the S or R inputs change first. Both inputs start out low, and if the S input goes high first, then the R input holds the latch in reset, or low. If the R input goes high first, then the S input controls the latch and the output goes high. Thus, the chains of flip flops 202, 204, 206 and 210 synchronize the rising and falling edges of the event signal Hit 30 with the clock 22, and the SR flip flop 212 indicates whether the event signal Hit 30 was sampled first by the flip flops 202 and 204 clocked by the rising edge of the clock 22 or by flip flips 206 and 210 clocked by the falling edge of the clock 22. This narrows the occurrence of the event down to within about a half a clock cycle. The SR flip flop 212 produces a signal First 214 for the counter edge selector 200 that indicates whether the event signal Hit 30 was sampled first by the flip flops 202 and 204 clocked by the rising edge of the clock 22 or by flip flips 206 and 210 clocked by the falling edge of the clock 22. (The chains of flip flops 202, 204, 206 and 210 and the SR flip flop 212 are also referred to herein as a clock phase detector, and the First signal 214 is also referred to herein as a clock phase indicator output.) Note that the synchronizing chains of flip flips can contain more or less than the two flip flips (e.g., 202 and 204) illustrated in FIG. 1 as desired to resolve instability in the event signal Hit 30 or to simplify the synchronizer 16 and make it smaller.

The use of both edges of the clock 22 is beneficial both for narrowing the occurrence of the event down to about a half clock cycle for use in synchronizing the interpolator 14 with the counter 12 and for preventing metastability problems. When sampling the event with a flip flop (e.g., 202 and 206), there is always the risk of metastability in which the flip flop has an uncertain sample of the input value, due for example to violation of setup times. Instead of generating a 1 or 0 on the output, some intermediate value is produced that cannot be interpreted properly. By sampling both the rising and the falling edges of the clock 22, there is redundancy in the sampling that ensures that metastability will not affect the results. Even if a metastable value is produced by one path through the flip flops, the other path will produce a proper value. The synchronization control signals 160 from the interpolator 14 then enable the counter edge selector 200 to select the correct path through the flip flops (e.g., 202 and 206) despite a metastability problem.

Turning now to FIG. 4, one particular embodiment of the counter edge selector 200 will be described. However, it is important to note that the counter edge selector 200 may be embodied in any number of suitable circuits. In one particular embodiment, the Hit_Sampled signal 220 from the second rising-edge-clocked flip flop 204 is fed into a chain of three delay elements 222, 224 and 226 that provide the delayed control signal 26 that latches the output 20 of the counter 12 in the latches 24 to store the coarse portion of the time stamp 34. The First signal 214 and the two control signals 186 from the interpolator 14, Comp_Hi 230 and Comp_Lo 232, are used to select the appropriate delay from the chain of three delay elements 222, 224 and 226 for use as the control signal 26. The First signal 214 is connected to a non-inverting input of a NAND gate 234, and the Comp_Hi signal 230 is connected to an inverting input of the NAND gate 234. The output of the NAND gate is used to control a multiplexer 236 to select either the output of the first or second delay elements 222 and 224. The First signal 214 is also connected to the inverting input of an AND gate 240 and the Comp_Lo signal 232 is connected to another inverting input of the AND gate 240. The output of the AND gate 240 is used to control another multiplexer 242 to select either the output of the first multiplexer 236 or the output of the third delay element 226. The output of the multiplexer 242 is synchronized with the clock 22 in a flip flop 244, and the inverted output of the flip flop 244 is combined with the output of the first delay element 222 in an AND gate 246 which produces the control signal 26. The delay D1 at the output 250 of the first delay element 222 selects counter value C−1, the delay D2 at the output 252 of the second delay element 224 selects counter value C, and the delay D3 at the output 254 of the third delay element 226 selects counter value C+1.

Figure 5A:
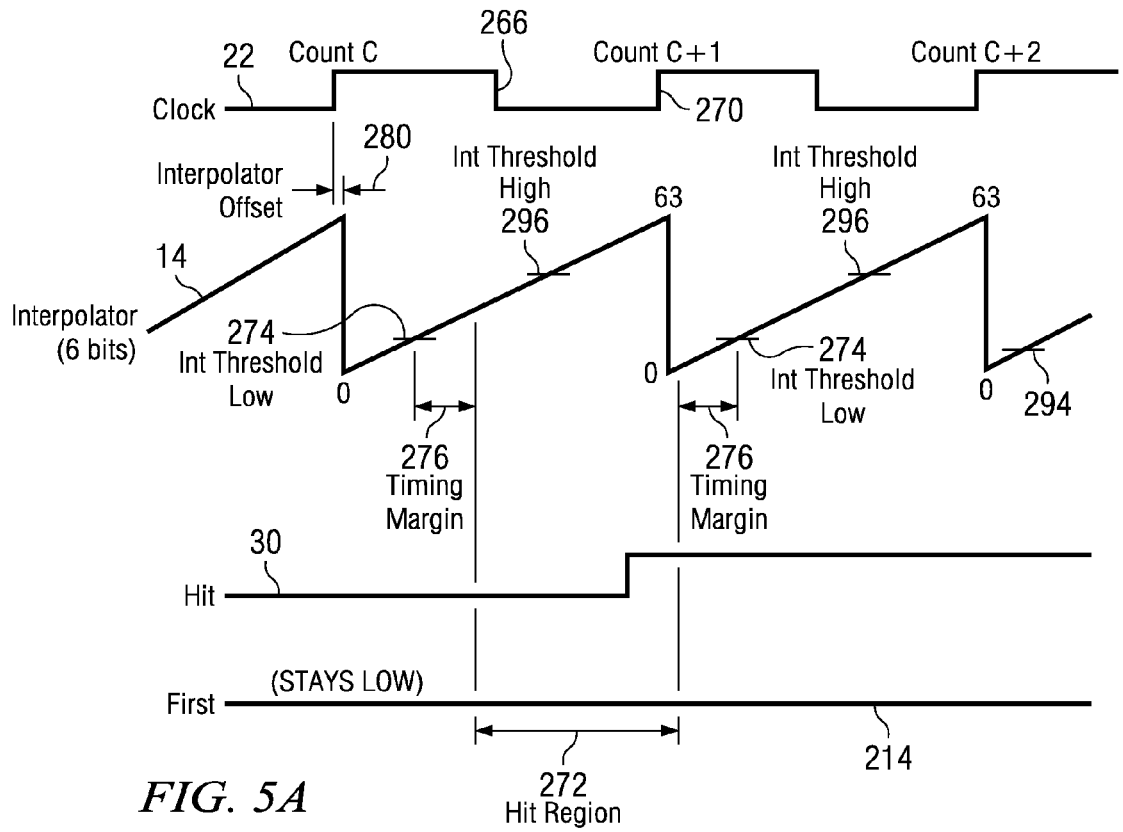
FIG. 5A is a timing diagram illustrating the synchronization of the interpolator and coarse clock counter according to one particular embodiment of the invention in which the event occurs before the clock rising edge.
Figure 5B:
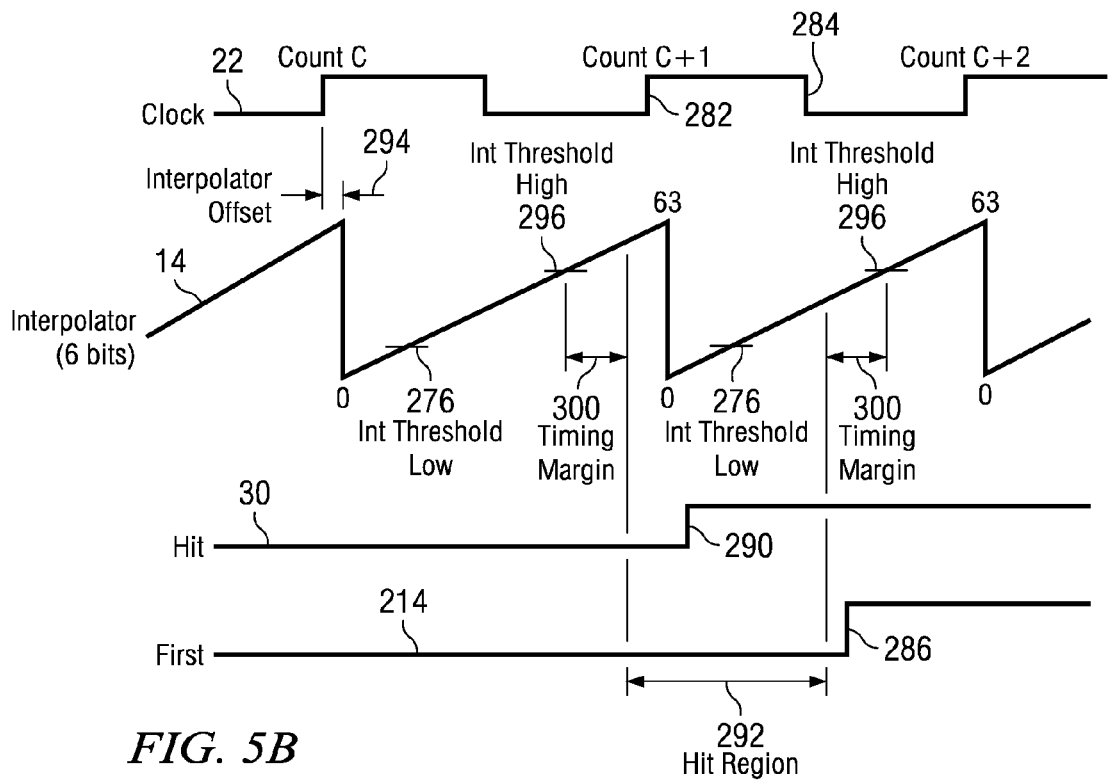
FIG. 5B is a timing diagram illustrating the synchronization of the interpolator and coarse clock counter according to one particular embodiment of the invention in which the event occurs after the clock rising edge.

Turning now to FIGS. 5A and 5B, the operation of the synchronizer 16 will be described in more detail. FIGS. 5A and 5B are timing diagrams of the clock 22, the output of the interpolator 14, the event signal Hit 30 and the signal First 214 from the SR flip flop 212. The timing diagrams of FIGS. 5A and 5B illustrate the disambiguation of a Hit signal 30 that may have arrived at a time when the counter 12 had a value of either count C or C+1, thereby selecting either the delay D2 at the output 252 of the second delay element 224 or the delay D3 at the output 254 of the third delay element 226. The sawtooth waveform illustrated as the output of the interpolator 14 represents the increasing value on the output of the interpolator 14, from 0 to $2^M-1$ (or 63 in one particular embodiment), that represents the time at which the event occurs. The timing diagram of FIG. 5A illustrates a case in which the event signal Hit 30 occurs before a rising edge on the clock 22, thus after a falling edge and in the second half of the clock cycle. The timing diagram of FIG. 5B illustrates a case in which the event signal Hit 30 occurs after a rising edge on the clock 22, thus before a falling edge and in the first half of the clock cycle. The First 214 signal from the SR flip flop 212 makes the determination of whether the event signal Hit 30 occurs in the first or second half of the clock cycle.

Consider now the first case illustrated in FIG. 5A, in which the First 214 signal remains low after the event signal Hit 30 has a rising edge. This indicates that the event (as signaled on the event signal Hit 30) occurred in the second half of the clock cycle, after a falling edge 266 and before a rising edge 270 on the clock 22. Because of uncertainties due to factors such as signal delays and latch set up times, etc, the hit region 272 in which the event may have occurred is actually slightly wider than the half clock period, so that the hit region 272 starts just before the falling edge 266 of the clock 22 and ends just after the rising edge 270 of the clock 22. The portions of the interpolator 14 sawtooth that fall within the hit region 272 range from a value of about 25 up to 63 and 0 to about 5. (Note that the output M-bit binary encoded output 40 of the interpolator 14 does not actually produce a sawtooth pattern as illustrated in FIGS. 3A and 3B. The sawtooth merely illustrates what the value of the output 40 would be if the event on Hit 30 occurred at each point in the clock cycle. Thus, the possible output values of the interpolator 14 are illustrated as a sawtooth that range from an output of 0 up to 63.) Note that if the event on the event signal Hit 30 occurs in the portion of the hit region 272 from about 25 to 63, it occurs in count C, and if the event occurs in the portion of the hit region 272 after the sawtooth restarts from 0 to about 5, the event occurs in count C+1. The interpolator 14 output range in which the event could not have occurred is between 5 and 25, for a midpoint of 16. This midpoint of the non-hit region is used as a lower interpolator threshold 274 to determine whether the event occurred at the upper region of the sawtooth or the lower region of the sawtooth in order to identify the count value that should be added to the interpolator value. For example, if the interpolator value is 50, this is greater than the lower interpolator threshold 274 of 16 and therefore on the upper part of the sawtooth, so the interpolator output should be added to count C. If the interpolator value is 20, this is lower than the lower interpolator threshold 274 of 16 and therefore on the lower region of the sawtooth. The interpolator output should be added to count C+1 in this case, because the lower region of the sawtooth occurs at count C+1. There is a wide timing margin 276 between the lower interpolator threshold 274 and the ends of the hit region 272. This enables the interpolator 14 to ensure that the interpolator output is added to the correct value from the counter 12, even in the presence of noise or other uncertainties.

The event timing to the interpolator may not be perfectly aligned with the clock edge timing to the synchronizer. This may create an offset 280 between the edge of the sawtooth and the rising edge of the counter 22. Note that this offset 280 does not affect the capturing of the interpolator residue or the accuracy of the time stamp, but may complicate the generation of the synchronization control signals 186 from the interpolator 14 to the synchronizer 16. However, because the offset 280 is a constant and known value, it can be backed out mathematically so that the top of the sawtooth is aligned with the rising edge of the clock 22 before the identification of the count value is made.

Turning now to FIG. 5B, the second case will be discussed in which the event occurs during the first and positive half cycle of the clock 22, after a rising edge 282 and before a falling edge 284. The First 214 signal in this case transitions high 286 after the event signal Hit 30 has a rising edge 290. This indicates that the event (as signaled on the event signal Hit 30) occurred in the first half of the clock cycle at count C+1, after the rising edge 282 and before the falling edge 284. The hit region 292 in this case is shifted to the right by half a clock cycle so the hit region 292 is centered on the period when the clock cycle is high. Again, the hit region 292 in which the event may have occurred is slightly wider than the half clock period, so that the hit region 292 starts just before the rising edge 282 of the clock 22 and ends just after the falling edge 284 of the clock 22. The portions of the interpolator 14 sawtooth that fall within the hit region 292 range in this case from about 54 to 63 before restarting and rising from 0 to about 30.

Again, the event timing to the interpolator may not be perfectly aligned with the clock edge timing to the synchronizer. This results in an offset 294 between the edge of the sawtooth and the rising edge of the counter 22. Note that this offset 294 does not affect the capturing of the interpolator residue or the accuracy of the time stamp, but may complicate the generation of the synchronization control signals 186 from the interpolator 14 to the synchronizer 16. However, because the offset 294 is a constant and known value, it can be backed out mathematically so that the top of the sawtooth is aligned with the rising edge of the clock 22 before the identification of the count value is made. Note that because the hit region 292 is slightly wider than the half clock cycle, the upper end of the sawtooth falls within the left-most portion of the hit region 292 even when the sawtooth is aligned with the rising edge of the clock 22.

If the event on the event signal Hit 30 occurs in the left-most portion of the hit region 292 from about 54 to 63 at the interpolator output, it occurs in count C, and if the event occurs in the portion of the hit region 292 after the sawtooth restarts from 0 to about 30, the event occurs in count C+1. The interpolator 14 output range in which the event could not have occurred is between 30 and 54, for a midpoint of 42. This midpoint of the non-hit region is used as an upper interpolator threshold 296 to determine whether the event occurred at the upper region of the sawtooth or the lower region of the sawtooth in order to identify the count value that should be added to the interpolator value. For example, if the interpolator value is 20, this is lower than the upper interpolator threshold 296 of 42 and therefore on the lower part of the sawtooth, so the interpolator output should be added to count C+1. If the interpolator value is 60, this is greater than the upper interpolator threshold 296 of 42 and therefore on the upper region of the sawtooth. The interpolator output should be added to count C in this case, because the upper region of the sawtooth occurs at count C. There is a wide timing margin 300 between the upper interpolator threshold 296 and the ends of the hit region 292. This enables the interpolator 14 to ensure that the interpolator output is added to the correct value from the counter 12, even in the presence of noise or other uncertainties. Note that the actual values of the lower interpolator threshold 274 and the upper interpolator threshold 296 are set based on the range of the interpolator 14, the alignment of the interpolator 14 sawtooth with the clock 22, the width of the hit regions 272 and 292, etc., and are not limited to the exemplary values presented herein.

Turning back to FIGS. 1 and 2, the synchronization control signals 186 from the interpolator 14 to the synchronizer 16 consists of a two bit word containing a Comp_Hi signal 260 (comparator high) and a Comp_Lo signal 262 (comparator low). The Comp_Hi signal 260 is asserted if the output 40 of the interpolator 14 is greater than the upper interpolator threshold 296, and the Comp_Lo signal 262 is asserted if the output 40 of the interpolator 14 is greater than the lower interpolator threshold 274. The synchronizer 16 can use this information in connection with the value on the First signal 214 to determine what value of the counter 12 should be added to the output 40 of the interpolator 14. Depending on the value of the First signal 214, the counter edge selector 200 in the synchronizer 16 looks at either the Comp_Hi signal 260 or Comp_Lo signal 262 to determine what value of the counter 12 to add to the output 40 of the interpolator 14, as discussed above.

The selection between counter value C and value C+1 discussed in FIGS. 5A and 5B may be expressed in the idealized truth table of Table 1 below.

TABLE 1

| First | Comp_Hi | Comp_Lo | Counter |
|---|---|---|---|
| 0 | X | 0 | C + 1 |
| 0 | X | 1 | C |
| 1 | 0 | X | C + 1 |
| 1 | 1 | X | C |

If the First signal 214 is low and the Comp_Lo signal 262 is low, the control signal 26 loads value C+1 from the clock 22 into the N latches 24. (The N latches 24 are latched on the falling edge of the control signal 26.) As discussed above, the Comp_Low signal 262 is low if the interpolator value was less than the lower interpolator threshold 274. In the example given above with respect to FIG. 5A, the interpolator value would have been between 0 and 5, meaning that the Hit signal 30 transitioned during count C+1. If the First signal 214 is low and the Comp_Lo signal 262 is high, meaning that the interpolator value was above the lower interpolator threshold 274, the control signal 26 loads value C. If the First signal 214 is high, as in the example of FIG. 5B, and the Comp_Hi signal is low, the control signal 26 loads counter value C+1. If the First signal 214 and the Comp_Hi signal are both high, the control signal 26 loads counter value C.

The interpolator 14 and synchronizer 16 function in a pipelined fashion, with the interpolator 14 capturing a sample first and the synchronizer 16 then determining what cycle of the counter 12 to combine with the output of the interpolator 14. This creates a delay in the coarse sample that may be compensated for if desired, for example by subtracting from the counter value or otherwise offsetting for to compensate for the delay. However, in one particular embodiment, time measurements are created by taking the difference between two time stamps, each generated by either the same time stamp apparatus 10 or by two time stamp apparatuses each having the same delay in the coarse sample, based on a free running counter 12 that never stops. As long as the delay is constant between the first time stamp captured by a sync pulse and the second time stamp captured by a Hit pulse, the fixed delay is cancelled out. The value stored in an optional calibration register (not shown) in the time stamp apparatus 10 may also be added to the final result to remove or to add any offset as desired.

Figure 6:
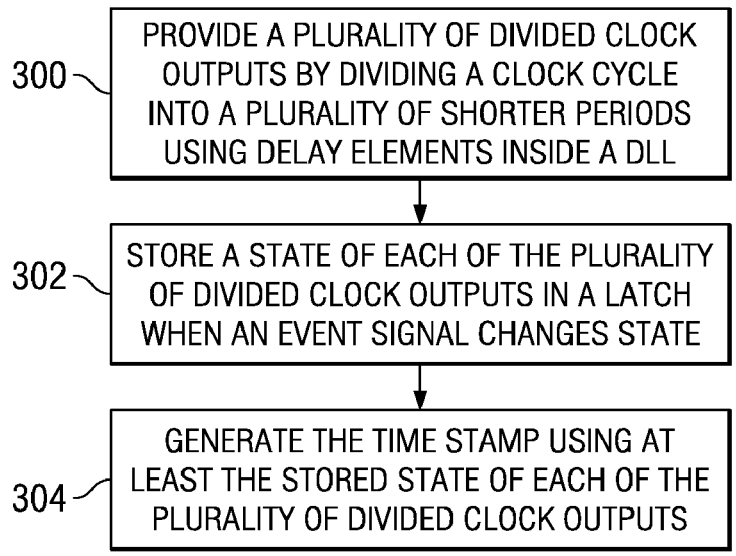
FIG. 6 is a flow chart of a method for generating a time stamp according to one particular embodiment of the invention.
Figure 7:
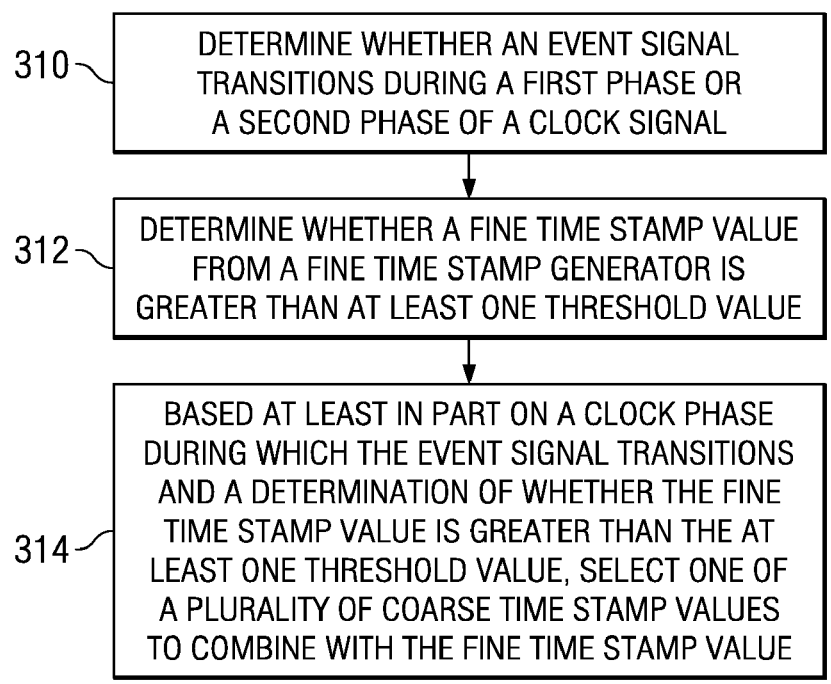
FIG. 7 is a flow chart of a method for synchronizing time stamps.

Methods of generating and synchronizing a time stamp are summarized in the flow charts of FIGS. 6 and 7. Turning now to FIG. 6, a method to generate an interpolated time stamp of one particular embodiment includes providing a plurality of divided clock outputs by dividing a clock cycle into a plurality of shorter periods using delay elements inside a DLL. (Block 300) The state of each of the plurality of divided clock outputs is stored in a latch when an event signal changes state. (Block 302) The time stamp is generated using at least the stored state of each of the plurality of divided clock outputs. (Block 304) Turning now to FIG. 7, a method to synchronize a coarse and a fine time stamp of one particular embodiment includes determining whether an event signal transitions during a first phase or a second phase of a clock signal. (Block 310) A determination is made as to whether a fine time stamp value from a fine time stamp generator is greater than at least one threshold value. (Block 312) Based at least in part on a clock phase during which the event signal transitions and a determination of whether the fine time stamp value is greater than the at least one threshold value, one of a plurality of coarse time stamp values is selected to combine with the fine time stamp value. (Block 314)

In conclusion, the present invention provides novel apparatuses for generating time stamps. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. An apparatus comprising:
a clock input;
an event signal input;
a time stamp output;
a delay lock loop (DLL) that is coupled to the clock input, wherein the DLL includes a plurality of delay elements;
a plurality of latches, wherein each delay element has an output that is coupled to a data input on a corresponding one of the plurality of latches, and wherein each of the plurality of latches includes an enable input that is coupled to the event signal input, and wherein each of the plurality of latches includes an output that is coupled to the time stamp output, and wherein the apparatus is adapted to produce a value on the time stamp output indicating a point at which the event signal input transitions between transitions on the clock input; and
a detector that is coupled between the plurality of latch outputs and the time stamp output, wherein the detector includes a plurality of NOR gates, and wherein each of the plurality of NOR gates has a plurality of inputs coupled to a number of contiguous ones of the plurality of latches.

2. The apparatus of claim 1, wherein the apparatus further comprises a plurality of resistor-capacitor (RC) delay lines each connected to one of the plurality of delay elements, wherein the plurality of latches are connected to a plurality of different delay points on each of the plurality of delay lines.

3. The apparatus of claim 2, wherein each RC delay line has a resistance that includes a resistor and has a capacitance that includes a parasitic capacitance of at least one of the plurality of latches.

4. The apparatus of claim 2, wherein the apparatus further comprises a current source that is coupled to an end of at least one of the plurality of RC delay lines, the current source is adapted to alter a time constant of the at least one of the plurality of RC delay lines.

5. The apparatus of claim 4, wherein the current source further comprises a DC current source.

6. The apparatus of claim 1, wherein the apparatus further comprises a decoder that is coupled between the detector and the time stamp output, wherein the decoder is adapted to convert a 2M-bit input to an M-bit output.

7. The apparatus of claim 6, wherein the decoder further comprises a comparator that is adapted to generate a signal indicating whether a value from the plurality of latches is greater than a threshold value.

8. The apparatus of claim 7, wherein the decoder further comprises a second comparator that is adapted to generate a second signal indicating whether the value from the plurality of latches is greater than a second threshold value.

9. The apparatus of claim 1, wherein the apparatus further a counter having an input that is coupled to the clock input and an output providing a plurality of most significant bits of a time stamp on the time stamp output, wherein the plurality of latches provide a least significant bit of the time stamp.

10. An apparatus for generating a time stamp, the apparatus comprising:
   a clock input;
   an event signal input;
   a time stamp output;
   a DLL connected to the clock input;
   a plurality of delay elements inside the DLL;
   a plurality of RC delay lines each connected to one of the plurality of delay elements, each of the plurality of RC delay lines having a resistance comprising at least one resistor and a capacitance comprising a parasitic capacitance of at least one of the plurality of latches, each of the plurality of RC delay lines having a current source connected at an end, the at least one current source being adapted to alter a time constant of the at least one of the plurality of RC delay lines;
   a plurality of latches, wherein the plurality of latches are connected to a plurality of different delay points on each of the plurality of RC delay lines, each of the plurality of latches also having an enable input connected to the event signal input;
   a detector connected to an output of each of the plurality of latches, the detector comprising a plurality of NOR gates, each of the plurality of NOR gates having a plurality of inputs connected to a number of contiguous ones of the plurality of latches;
   a decoder connected to an output of the detector, the decoder being adapted to convert a 2M-bit input to an M-bit output, the decoder further comprising a comparator adapted to generate a signal indicating whether a value from the plurality of latches is greater than a threshold value and a second comparator adapted to generate a second signal indicating whether the value from the plurality of latches is greater than a second threshold value; and
   a counter, the apparatus being adapted to produce a value on the time stamp output based at least in part on an output of the counter as the most significant bits of the time stamp and the M-bit output of the decoder as the least significant bits of the time stamp.

11. An apparatus that produces a value indicating a point at which an event signal transitions between transitions of a clock signal, the apparatus comprising:
   a DLL that receives the clock signal and that has a plurality of taps;
   a plurality of column circuits, wherein each column circuit is associated with at least one of the taps, and wherein each column circuit includes a plurality of latches, and wherein each latch from each column has a data input that is coupled to its associated tap and an enable input that receives the event signal; and
   a detector having a plurality of NOR gates, wherein each NOR gate is associated with at least one of the column circuits, and wherein each NOR gate is coupled to an output from each latch within its associated column circuit.

12. The apparatus of claim 11, wherein each column circuit further comprises an RC delay line that is coupled between its associated tap and each of its latches.

13. The apparatus of claim 12, wherein the apparatus further comprises a decoder that is coupled to each NOR gate.

14. The apparatus of claim 13, wherein the DLL further comprises delay line having the plurality of taps.

15. An apparatus comprising:
   an interpolator having:
      a DLL that receives a clock signal and that has a plurality of taps;
      a plurality of column circuits, wherein each column circuit is associated with at least one of the taps, and wherein each column circuit includes a plurality of latches, and wherein each latch from each column has a data input that is coupled to its associated tap and an enable input that receives an event signal; and
      a detector having a plurality of NOR gates, wherein each NOR gate is associated with at least one of the column circuits, and wherein each NOR gate is coupled to an output from each latch within its associated column circuit;
   a synchronizer that is coupled to the interpolator and that receives the clock signal and the event signal;
   a counter that receives the clock signal;
   a first latching circuit that is coupled to the counter and the synchronizer; and
   a second latching circuit that is coupled to the interpolator.

16. The apparatus of claim 15, wherein each column circuit further comprises an RC delay line that is coupled between its associated tap and each of its latches.

17. The apparatus of claim 16, wherein the apparatus further comprises a decoder that is coupled to each NOR gate and the synchronizer.

18. The apparatus of claim 17, wherein the DLL further comprises delay line having the plurality of taps.

19. The apparatus of claim 18, wherein the synchronizer further comprises:
   a first flip-flop that receives the event signal and the clock signal;
   a second flip-flop that receives the clock signal and that is coupled to the first flip-flop;
   a third flip-flop that receives the event signal and an inverse of the clock signal;
   a fourth flip-flop that receives the inverse of the clock signal and that is coupled to the third flip-flop;
   a fifth flip-flop that is coupled to the second and fourth flip-flops; and
   an edge selector that is coupled to the second flip-flop, the fifth flip-flop, and the first latching circuit.

20. The apparatus of claim 19, wherein the edge selector further comprises:
- a plurality of delay elements coupled in series with one another in a first sequence, wherein the first delay element of the first sequence is coupled to the second flip-flop;
- a plurality multiplexers coupled in series with one another in a second sequence, wherein the first multiplexer of the second sequence is coupled across the second delay element of the first sequence;
- a sixth flip-flop that is coupled to the last multiplexer of the second sequence; and
- a logic circuit that is coupled to the fifth flip-flop, the interpolator, and each multiplexer.

* * * * *